United States Patent [19]

Smith

[11] Patent Number: 5,747,798
[45] Date of Patent: May 5, 1998

[54] PHOTOCELL CHECKER

[75] Inventor: Howard T. Smith, Winnetka, Calif.

[73] Assignee: Hughey & Phillips, Inc., Simi Valley, Calif.

[21] Appl. No.: 684,409

[22] Filed: Jul. 19, 1996

[51] Int. Cl.$^6$ .................................................. H01J 40/14
[52] U.S. Cl. .................................. 250/239; 250/214 AL; 250/214 B
[58] Field of Search ........................ 250/214 A, 214 AL, 250/214 B, 214 R, 239, 559.16

[56] References Cited

U.S. PATENT DOCUMENTS

| | | | |
|---|---|---|---|
| 3,240,943 | 3/1966 | White | 250/206 |
| 3,450,939 | 6/1969 | Misencik | 315/156 |
| 3,523,739 | 8/1970 | Weisglass | 250/214 SG |
| 3,630,627 | 12/1971 | Low | 356/222 |
| 4,196,994 | 4/1980 | de Jesus et al. | 250/239 |
| 4,330,706 | 5/1982 | Lawenhaupt | 250/214 AL |
| 4,644,149 | 2/1987 | Tsunekawa et al. | 250/214 A |

*Primary Examiner*—Stephone B. Allen
*Attorney, Agent, or Firm*—Louis J. Hoffman

[57] ABSTRACT

A continuously active artificial light source, such as a light-emitting diode (LED), is supported in a housing that also contains a photocell, and is directed at the operating detection surface of the photocell. A light-transmitting diffuser, such as made of translucent plastic, covers the detection surface of the photocell and allows ambient light to pass to the surface, which thereby detect a combination of external ambient light and light from the artificial source. The light source thereby biases the photocell, so that, in normal operation, the photocell produces an output voltage that does not exceed a predetermined value. The predetermined value is set at a level approximating the output voltage measured during total darkness outside the photocell housing. If an open-circuit condition occurs, the voltage of the photocell will exceed that predetermined value, thus permitting the checking circuit to recognize a faulty photocell.

20 Claims, 5 Drawing Sheets

| Ambient Light ft-cd | Photocell voltage LED Off | Photocell voltage LED On | LED is off A/D Counts | LED is off µController Action | LED is on A/D Counts | LED is on µController Action |
|---|---|---|---|---|---|---|
| 0(dark) | 4.798 | 4.571 | 245 | alarm (>239) | 233 | night(145-239) |
| 0.01 | 4.787 | 4.559 | 244 | alarm | 233 | " |
| 0.05 | 4.738 | 4.52 | 242 | alarm | 231 | " |
| 0.1 | 4.685 | 4.468 | 239 | night | 228 | " |
| 0.5 | 4.317 | 4.147 | 220 | " | 211 | " |
| 1.0 | 3.945 | 3.806 | 201 | " | 194 | " |
| 2.0 | 3.4 | 3.309 | 173 | " | 169 | night |
| 3.5 | 2.863 | 2.803 | 146 | night | 143 | night or twilight (142-144) |
| 5.0 | 2.495 | 2.456 | 127 | twilight | 125 | twilight (47-141) |
| 10 | 1.834 | 1.812 | 94 | " | 92 | " |
| 30 | 1.083 | 1.08 | 55 | " | 55 | |
| 35 | 1.015 | 1.012 | 52 | twilight | 52 | twilight |
| 47.5 | 0.892 | 0.891 | 45 | twilight or day | 45 | twilight or day (44-46) |
| 60 | 0.819 | 0.818 | 42 | day | 42 | day (2-43) |
| 70 | 0.778 | 0.777 | 40 | " | 40 | " |
| 100 | 0.697 | 0.696 | 36 | " | 35 | " |
| 500 | 0.525 | 0.525 | 27 | " | 27 | " |
| 1000 | 0.4997 | 0.4999 | 25 | " | 25 | " |
| 1500 | 0.4903 | 0.4905 | 25 | " | 25 | " |
| 2000 | 0.4858 | 0.486 | 25 | day | 25 | day |
| (short) | 0.0000 | 0.000 | 0 | alarm | 0 | alarm (0-1) |

| A/D count range | µController output |
|---|---|
| 240-255 | High Fault (photocell is open circuit) |
| 145-239 | Night |
| 142-144 | Night/Twilight (hysteresis band) |
| 47-141 | Twilight |
| 44-46 | Twilight/Day (hysteresis band) |
| 2-43 | Day |
| 0-1 | Low Fault (photocell is short circuit) |

PHOTOCELL CHECKER

FIELD OF THE INVENTION

This invention is in the field of electrical circuits and equipment designed to detect faults in a photocell, particularly an open-circuit condition, automatically and while the photocell is operating.

BACKGROUND OF THE INVENTION

Photocell circuits are used in a variety of uses where it is desired to determine the level of lighting. Often, the photocell measures ambient lighting, and the output of the photocell is used to activate or deactivate electrical lights when the natural lighting falls below a certain level because of weather conditions or nightfall.

The output of the photocell is typically a resistance value, which can be measured or used directly to drive another device. The range of resistance values can be quite wide. For example, certain well-known cadmium-sulfide photocells can exhibit resistance of 40 mega-ohms in total darkness and 50 ohms in bright daylight—a range that extends across nearly six full orders of magnitude. The output is non-linear, with resistance changing little for differences in light level at high light intensities.

Photocell circuits of this sort can fail by short-circuiting or by becoming an open circuit. Open circuits are particularly difficult to detect automatically, because an open circuit has high resistance, which, to many detection circuits, appears equivalent to a normally operating photocell that is in near-total darkness. Known systems of detecting photocell faults are incapable of distinguishing between dark and open-circuit conditions.

Most photocell checking systems are designed for manual operation. For example, U.S. Pat. No. 3,630,627 discloses a test system in which a lamp is directed at the photocell and the output of the photocell checked. However, such manual testing systems cannot be used for continuous testing, or testing during normal operation of the photocell. The requirement that the photocell-driven device be removed from service to test the photocell presents a significant disadvantage.

Photocells are sometimes used in circumstances where reliability is essential, such as turning on airport runway or aircraft warning lights, in which safety requires reliable operation. They may also be used on remote locations. In such cases in particular, manual checking of the photocell is not sufficient. Other typical uses for such photocells are for automatic streetlights or lights for houses.

It is, therefore, an object of the invention to provide systems and methods for automatically detecting faults in an operating photocell.

It is another object of the invention to provide systems and methods for distinguishing between darkness and an open circuit in an operating photocell.

It is another object of the invention to provide a photocell checker that can check the condition of a working photocell, without hindering the photocell's operation.

The invention achieves the above and other objects of the invention by a system that includes an artificial light source, such as a light-emitting diode (LED), which is supported in a housing that also contains the photocell, which is directed at the operating detection surface of the photocell, and which is continuously active. A light-transmitting diffuser, such as made of frosted plastic, covers the detection surface of the photocell and allows ambient light to pass through a wall of the housing to the detection surface. Preferably, the LED is directed at a diffuse cover, and the photocell thus detects a combination of external ambient light and light from the artificial source. The light source thereby biases the photocell, so that, in normal operation, the output voltage of the photocell does not exceed a predetermined value. The predetermined value is set at a level approximating the voltage produced during total darkness outside the photocell housing. If an open-circuit condition occurs, however, the output voltage of the photocell will exceed that predetermined resistance, thus permitting the checking circuit to recognize a faulty photocell.

Other aspects of the invention will be appreciated by those skilled in the art after a reading of the detailed disclosure of the present invention below.

BRIEF DESCRIPTION OF THE DRAWINGS

FIG. 3 is a table showing certain values of photocell voltages and their interpretations.

Common numerals are used in the several figures to indicate similar elements.

DETAILED DESCRIPTION

Figure 1:
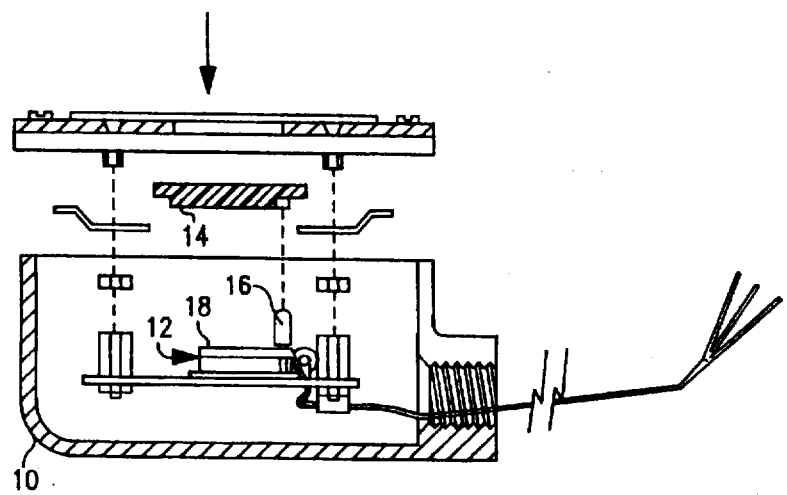
FIG. 1 is a cross-sectional view of elements of a preferred embodiment in accordance with the invention.

FIG. 1 shows a cross-section of a structural embodiment of certain aspects of the invention. Housing 10 contains photocell 12, light-transmitting diffuser 14, and LED 16. Photocell 12 can be a cadmium-sulfide cell of known design, as described above, or any unit having a light-sensitive surface 18. Ambient light (indicated by arrows in FIG. 1) passes through diffuser 14 to strike surface 18. LED 16 is of known design, and may be replaced with another suitable source of light.

Diffuser 14 can be made of frosted plexiglass or another transparent or translucent material. Lucite or polycarbonate materials have been found suitable. It is preferred to use a material that diffuses the ambient light, to prevent spots of light from striking surface 18 unevenly, which may adversely affect the reading from photocell 12. In addition, the light from LED 16 is spread relatively evenly across diffuser 14, and therefrom across surface 18. One surface of diffuser 14 is frosted.

In an alternative embodiment (not shown), LED 16 can be aimed directly at surface 18.

Figure 2:
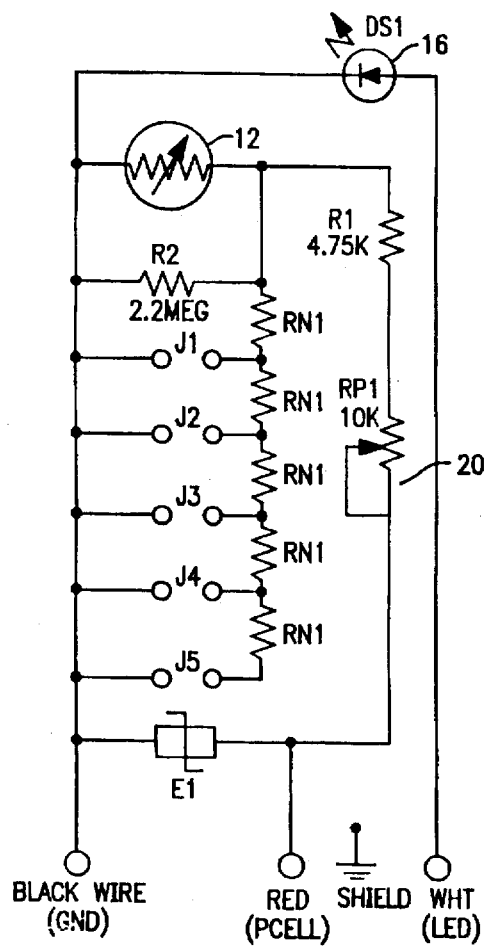
FIG. 2 is an electrical schematic diagram showing the principal electrical features of the photocell of the embodiment of FIG. 1.

FIG. 2 shows a schematic diagram of the circuit, with example resistance values and wiring. Essentially, the circuit is configured as a resistive voltage divider with photocell 12 being used as the variable element, sensing the light intensity. The resistance of photocell 12 is inversely proportional to the level of illumination. The output voltage V will vary inversely as a function of the light intensity, according to the formula $V=Vin(Rpc/(Rpc+Rb))$, where Vin is the input voltage, Rb is the value of the fixed resistor, and Rpc is the variable resistance value. The brightness of LED 16 can be adjusted by changing trim pot 20, in series with LED 16. Voltage suppressor E1 prevents damage from spiking.

A value Vmax for output voltage is predetermined as a cut-off. The value is selected depending on the sensitivity of the checker desired. However, Vmax is related to the voltage produced by photocell 12 with no ambient light and LED activated. Vmax may be set exactly at that level. Or, it may be desired to set the predetermined cut-off level slightly below the output voltage measured under those conditions, to permit some tolerance for error. Alternatively, because complete darkness is not a realistic condition in the real world—at least not for uses out-of-doors, because of starlight and so forth—it may be desired to set the cut-off at a level slightly higher than the level measured in complete darkness.

Whatever the level selected for Vmax, it is necessary to calibrate the circuit to cause photocell 12 to produce the desired output voltage. Because the sensitivity of individual photocell units vary, it is necessary to compensate for this, preferably by adjusting the intensity of LED 16. A regulated voltage source can be used in this calibration step. Jumpers J1–J5 in FIG. 2 can be connected to add the values of any of series resistors RN1 to the resistance value of fixed resistor R2.

The output voltage of photocell 12 in the inventive arrangement is continually monitored, and if it exceeds Vmax, a fault light or other warning system is activated, indicating an open circuit. If LED 16 fails, Vmax will be exceeded as well, at least under some low-light conditions, and the fault light will cause the maintenance personnel to check the photocell unit.

A short is observed by the system as a drop in the output voltage to a low level. A predetermined minimum voltage, Vmin, can be established, and if the voltage falls below Vmin, the system will issue a warning identifying a short.

The voltage is preferably digitized with an A-D converter, permitting digital definition of levels Vmax and Vmin as "counts" from the A-D output. The table in FIG. 3 shows a variety of example correlations between light intensity (in foot-candles), photocell voltage output, output counts, and controller interpretations (see "LED On" columns). In FIG. 3, the level of Vmax might be set at 239 counts, for example, and the level of Vmin might be set at 2 counts, for example. A list of interpretations of each level of counts, for one example groups of settings, is shown at the bottom of FIG. 3.

FIG. 3 also illustrates numerically the effect of the addition of LED 16 to the checker design. The addition of LED 16 (as seen by comparing the "LED On" to the "LED Off" columns) shifts the operating region away from the "total darkness" area. The amount of the shift depends on the brightness of the LED.

Without LED 16, as seen in the double column labeled "LED is off," of FIG. 3 it is difficult to distinguish between night-time conditions and an open circuit. For example, if Vmax were set at 239 counts, as shown, a hypothetical photocell checker without LED 16 would have many instances of false alarms or failure to detect open circuits, because (1) small changes in detected illumination (e.g., a change from 0.10 to 0.08 foot-candelas) could move the observed number of counts across the Vmax boundary; and (2) the variation in operation of the photocell itself, or stray voltages introduced by other circuitry, could also cause the number of counts to cross the Vmax boundary. By contrast, using LED 16 (see "LED is on" double column at the right side of FIG. 3) permits a sharp distinction between night-time and open circuit conditions. If, for example, Vmax is set at 239 counts, as shown, there is essentially no possibility of crossing that boundary regardless of how dark the ambient conditions observed by the photocell become. Also, there is no possibility of failing to detect an open circuit, because under that condition, the count will clearly exceed 239 counts, because any stray voltage cannot exceed the value necessary to reduce the counts below 240.

If desired, LED 16 can be switched or pulsed on and off, manually or automatically (such as under the control of the controller), to verify that the photocell is responding to light stimulus. This is also useful in detecting whether LED 16 is operating. If not, the number of counts will not change (or change very much) when LED 16 is switched between off and on.

One application of the photocell checker described above that has been found particularly useful is in connection with lighting of structures, in accordance with FAA requirements, to avoid collisions by airplanes. FAA requirements specify that any temporary or permanent structure exceeding 200 feet above ground level should be marked or lighted to prevent it from being a hazard to aircraft. Most radio towers and chimneys exceed those limits and are marked with multiple lights. Lighting failures must be reported to the FAA, and the structure operators must constantly monitor warning lights for failure. In addition, the FAA requires that the intensity of warning lights must change in accordance with ambient lighting conditions. In daylight, a brighter light is required to make the structure conspicuous; while at night, a lowered intensity is desired, to avoid blinding or appearing objectionably bright to air or ground traffic. Photocell units are frequently used to measure ambient light and control the intensity of the marker lights. The photocell is typically positioned with an unobstructed view of the polar sky, in a direction that will not result in any interference from external artificial light sources.

The FAA recently required that all such lighting systems be capable of determining automatically that the photocell is functioning correctly. If a photocell problem is detected, the lighting system switches to a default mode and a fault signal or alarm is issued. Typically, the default mode is operation of the lights at their brightest intensity. The alarm is typically the closure or opening of a set of relay contacts, to the operator of the structure. Other relays connect a control voltage to other switching circuits within the power supply for the light unit to alter the intensity of the light.

Figure 4:
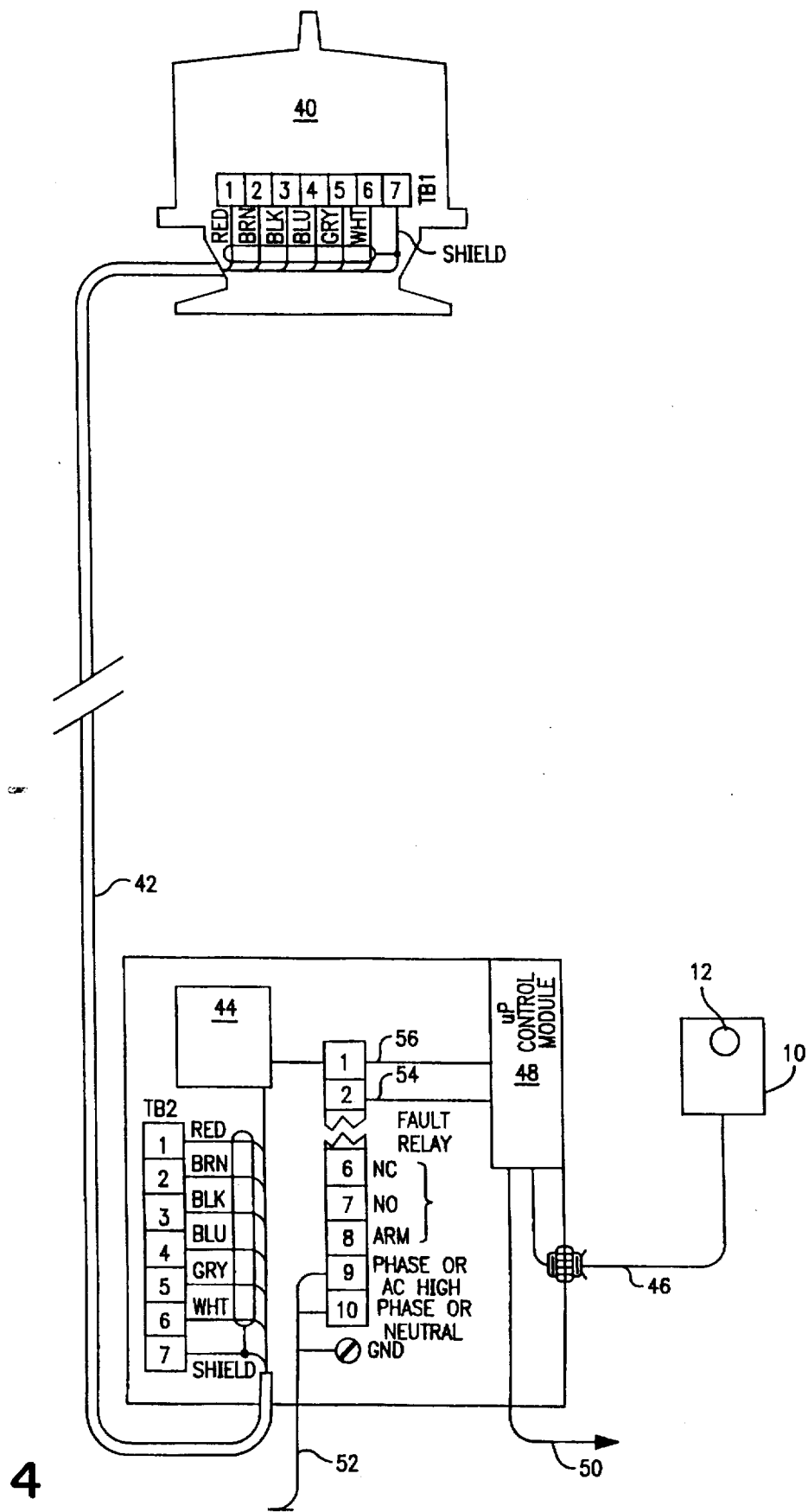
FIG. 4 is a diagram showing an example system in which the invention can be used.

An example lighting system with a strobe-type flashhead 40 is shown in FIG. 4. Flashhead 40 is connected through cable 42, which may be up to a thousand feet long, to a power supply 44 of conventional design. Photocell 12 in unit 10 (in accordance with FIG. 1) is wired by connector 46 to a control module 48, which is shown in more detail in the electrical diagram of FIG. 5. Connector 46 contains the LED power, signal, and ground lines shown at the bottom of FIG. 2 and the left of FIG. 5. Control relay 50 (shown in FIG. 4 and the bottom, right corner of FIG. 5), provides an alarm output. Although control module 48 is shown as part of the housing containing power supply 44, it can alternatively be assembled together with photocell housing 10, or modules 10 and 44 can be combined into a unitary housing.

Primary AC input power line 52 provides power to power supply 44 (see terminals 9 and 10 of terminal board TB1), and from there to strobe 40 through terminal board TB2 and cable 42. Power line 52 also powers control module 48 through power line 54. Control signals from control module 48 pass through relay line 56 (see also top, right of FIG. 5) and terminal 1 of TB1 to power supply 44, which determines the mode of operation of strobe 40, namely day or night operation. Terminals 3–5 of TB1 of FIG. 4 are synch lines for additional strobe units like flashhead 40, which might be in a common system. Terminals 6–8 of TB1 are standard fault relays for the operation of strobe 40.

Figure 5A:
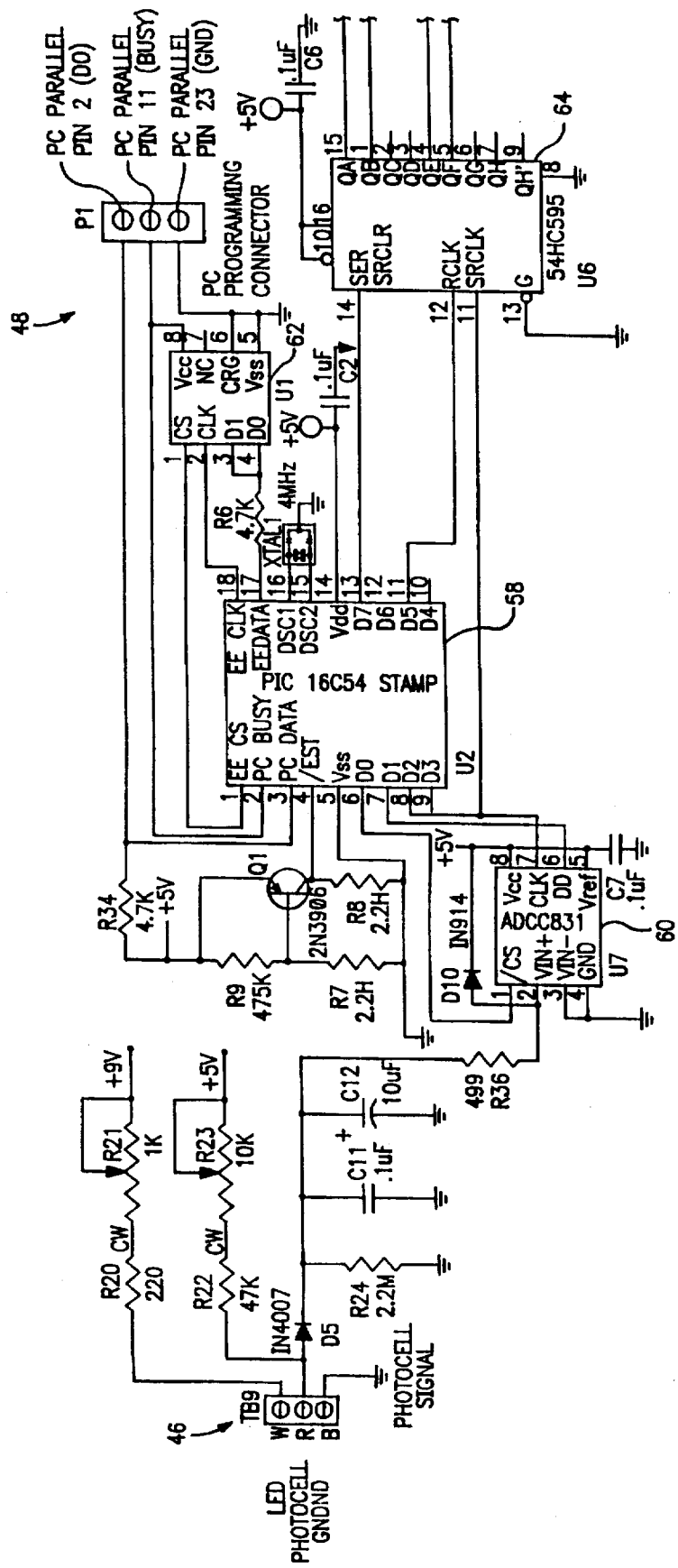
FIG. 5 is a detailed electrical diagram of an embodiment of the control system of the invention.
Figure 5B:
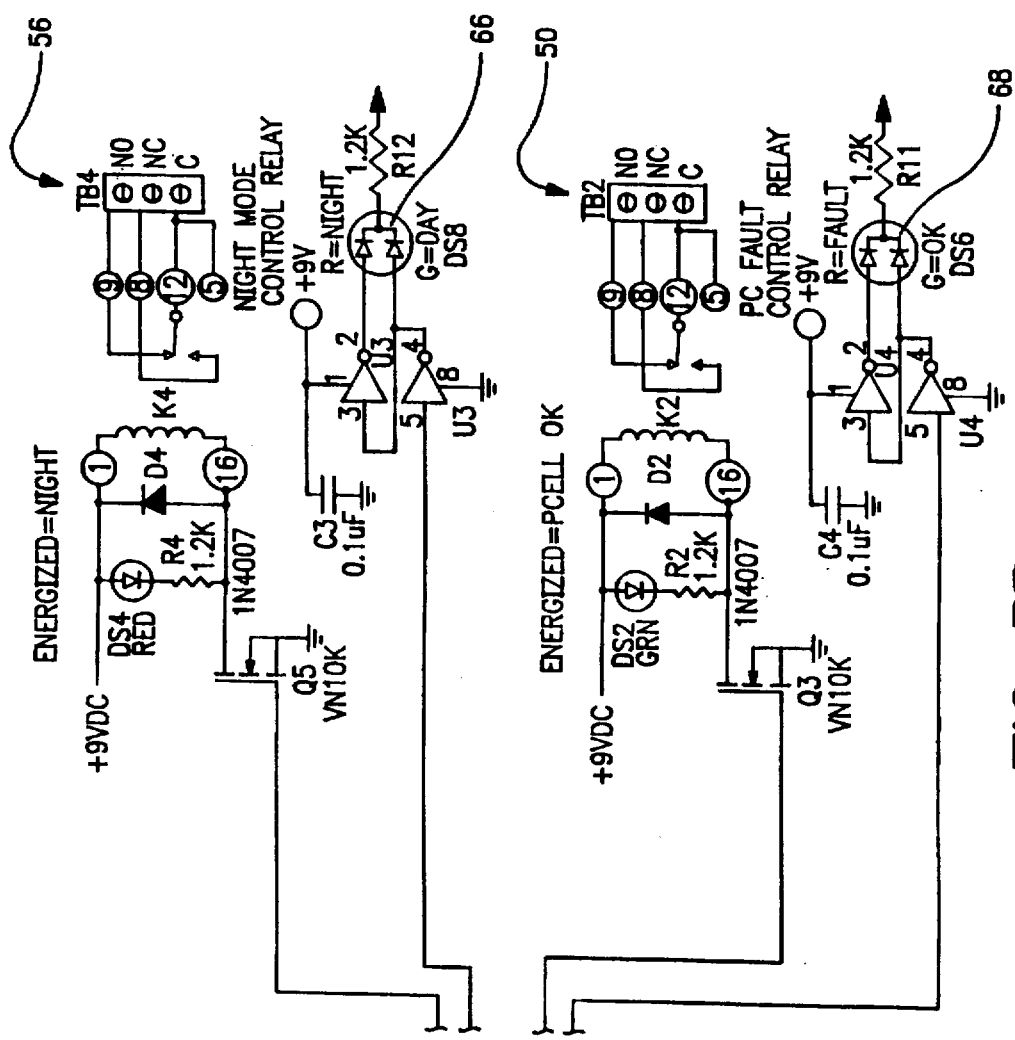

In FIG. 5, microcontroller 58 implements count tests (shown at the bottom of FIG. 3) under the control of ROM 62, which is an EEPROM that stores the operating program. The PIC 16C54 chip sold by Microchip Technology, Inc. of Chandler, Ariz. has been found suitable for microcontroller 58. A-D converter 60 digitizes the output signal from photocell 12, to create the counts discussed above. The output of microcontroller 58 is passed to serial shift register 64, which controls relays 50 and 56 discussed above and indicator lights 66 and 68 (showing night/day modes and photocell faults, respectively).

Although the invention has been described with reference to specific embodiments, many modifications and variations of such embodiments can without departing from the innovative concepts disclosed.

Unless specifically noted, it is intended that the words and phrases in the specification and claims be given the ordinary and accustomed meaning to those of ordinary skill in the applicable art or arts. If any other meaning is intended, the specification will specifically state that a special meaning is being applied to a word or phrase.

Likewise, any use of the word "function" in the specification, or any claim words that define or imply a function, is not intended to invoke the provisions of 35 U.S.C. §112, ¶6 to define the invention. To the contrary, that paragraph will be considered to define a claimed element of the invention, only if the phrases "means for" or "step for" and a function, without also reciting in that element any structure, material, or act in support of the function, are specifically recited in that claim element. Moreover, even if the provisions of 35 U.S.C. §112, ¶6 are invoked to define the invention, patentee intends that the invention not be limited to the specific structure, material, or acts that are described in the preferred embodiments. Rather, "means for" or "step for" elements are nonetheless intended to cover and include within their scope any and all known or later-developed structures, materials, or acts that perform the claimed function, along with any and all equivalents.

Thus, it is understood by those skilled in the art that alternative forms and embodiments of the invention can be devised without departing from its spirit and scope. The foregoing and all other such modifications and variations are intended to be included within the spirit and scope of the appended claims.

I claim:

1. A system for continuously checking a photocell comprising:
   (a) a housing configured to receive and electrically connect a photocell;
   (b) a light-transmitting diffuser in a wall of the housing; and
   (c) a light source in the housing and directed at the diffuser.

2. The apparatus of claim 1 further comprising a photocell in the housing and having a light-receiving surface opposing the diffuser.

3. The apparatus of claim 2 further comprising an analog-to-digital converter electrically coupled to the photocell; and a microcontroller coupled to the converter and programmed to issue a command signal if the photocell produces a signal having voltage exceeding a predetermined maximum.

4. The apparatus of claim 1 wherein the diffuser comprises a frosted plastic cover.

5. The apparatus of claim 1 wherein the light source is a light-emitting diode.

6. An apparatus for continuously checking a photocell comprising:
   (a) a housing;
   (b) a photocell in the housing and having a light-receiving surface and an electrical output line;
   (c) a light-transmitting diffuser in a wall of the housing facing the light-receiving surface;
   (d) a light in the housing aimed at the diffuser;
   (e) an analog-to-digital converter coupled to the electrical output line; and
   (f) a microcontroller coupled to the converter and programmed to issue a command signal if the voltage on the electrical output line exceeds a predetermined maximum.

7. The apparatus of claim 6 wherein the photocell is a cadmium-sulfide cell.

8. The apparatus of claim 6 wherein the light consists of a light-emitting diode.

9. The apparatus of claim 6 wherein the diffuser comprises frosted plexiglass.

10. The apparatus of claim 6 wherein the microcontroller is further programmed to issue a command signal if the voltage on the electrical output line falls below a predetermined threshold.

11. The apparatus of claim 10 wherein the photocell is a cadmium-sulfide cell; wherein the light consists of a light-emitting diode; and wherein the diffuser comprises frosted plexiglass.

12. A method for checking a photocell positioned to receive ambient light comprising:
   (a) continuously directing an artificial light at the photocell while it is receiving ambient light as well;
   (b) continuously monitoring output voltage of the photocell;
   (c) comparing the output voltage with a predetermined voltage level; and
   (d) when the output voltage exceeds the predetermined level, issuing a warning.

13. The method of claim 12 wherein issuing a warning comprises activating a relay contact.

14. The method of claim 12 wherein directing an artificial light at the photocell comprises aiming a light at a diffuser through which the ambient light passes.

15. The method of claim 13 wherein the light is produced by a light-emitting diode inside a housing containing the photocell, and wherein the diffuser makes up a substantial portion of a wall of the housing.

16. The method of claim 12 wherein the predetermined level is preset at a level approximating a dark output voltage, which is the voltage produced by the photocell in the presence of the directed artificial light but in the absence of ambient light.

17. The method of claim 16 wherein the predetermined level is preset at a level equal to the dark output voltage.

18. The method of claim 16 wherein the predetermined level is preset at a level slightly greater than the dark output voltage.

19. The method of claim 12 further comprising comparing the output voltage with a predetermined voltage threshold, and when the output voltage falls below the predetermined level, issuing a warning.

20. The method of claim 19 wherein issuing a warning comprises activating a relay contact; wherein directing an artificial light at the photocell comprises aiming a light at a diffuser through which the ambient light passes; wherein the light is produced by a light-emitting diode inside a housing containing the photocell; and wherein the diffuser makes up a substantial portion of a wall of the housing.

* * * * *